United States Patent [19]
Schimert et al.

[11] Patent Number: 6,133,570
[45] Date of Patent: Oct. 17, 2000

[54] SEMICONDUCTOR PHOTOVOLTAIC DIFFRACTIVE RESONANT OPTICAL CAVITY INFRARED DETECTOR

[75] Inventors: Thomas Robert Schimert, Ovilla; Dayton D. Eden, Dallas, both of Tex.

[73] Assignee: Lockheed Martin Corporation, Bethesda, Md.

[21] Appl. No.: 08/218,472

[22] Filed: Mar. 15, 1994

[51] Int. Cl.[7] .................................................. H01L 27/14
[52] U.S. Cl. ........................................ 250/338.1; 257/530
[58] Field of Search ............................. 250/338.1; 257/53

[56] References Cited

U.S. PATENT DOCUMENTS

| | | | |
|---|---|---|---|
| 4,620,364 | 11/1986 | Landis | 29/572 |
| 4,639,756 | 1/1987 | Rosbeck et al. | 357/30 |
| 4,731,640 | 3/1988 | Bluzer | 357/30 |
| 4,875,084 | 10/1989 | Tohyama | 357/30 |
| 4,970,567 | 11/1990 | Ahlgren et al. | 357/30 |
| 5,047,622 | 9/1991 | Chu | 250/338.1 |
| 5,075,749 | 12/1991 | Chi et al. | 357/30 |
| 5,179,283 | 1/1993 | Cockrum et al. | 250/352 |

OTHER PUBLICATIONS

R.B. Broudy, D.R. Resler, P.W. Pastel, M.B. Reine and C.C. Wang, "The Resonant–Optical–Cavity HgCdTe Heterojunction Photodiode—A New Device for 10.6 μm Heterodyne Detection at 2GHz", in the Proc. IRIS Detector, 1987, vol. III, pp. 189–200.

Proceedings of the IEEE, vol. 73, No. 5, May 1985, pp. 894–938, T.K. Gaylord and M.G. Moharam, "Analysis and Applications of Optical Diffraction by Gratings".

M.B. Reine, A.K. Sood and T.J. Tredwell, "Photovoltaic Infrared Detectors", Chapter 6, pp. 201–311, *Semiconductors and Semimetals*, edited by R.K. Willardson and A.C. Beer, vol. 18, Mercury Cadmium Telluride, 1981, Academic Press.

Bredy et al, IRIS Detector, 1987, vol. III, p. 189–200.

*Primary Examiner*—Nelson Moskowitz
*Attorney, Agent, or Firm*—Sidley & Austin; Stephen S. Sadacca

[57] ABSTRACT

An infrared detector cell includes a plurality of uniformly spaced linear segments, which make up an optical grating. Each segment is selectively doped across its width to form a photovoltaic diode. The linear segments are ohmically connected between electrical conductors to produce a single cell detection signal. The cell comprises a diffractive resonant optical cavity. An array of cells can produce an infrared image. Cell configurations are illustrated for receiving both single dimension and linearly polarized radiation and two-dimension unpolarized radiation.

23 Claims, 3 Drawing Sheets

SEMICONDUCTOR PHOTOVOLTAIC DIFFRACTIVE RESONANT OPTICAL CAVITY INFRARED DETECTOR

FIELD OF THE INVENTION

The present invention pertains in general to infrared detectors and in particular to an infrared detector having a photovoltaic detector diode.

BACKGROUND OF THE INVENTION

Infrared detector cells, and corresponding arrays, are used to produce images in situations where optical imaging is not effective, such as in darkness, or where infrared signatures provide additional information about the target.

Continuing objectives in the design of infrared detectors are to increase detectivity performance (D*) and to increase the resistance of the diode detectors.

A prior heterojunction photovoltaic refractive resonant optical cavity infrared detector which has thermal detector regions, but is configured as a large area detector, is described in "The Resonant-Optical-Cavity HgCdTe Heterojunction Photodiode—A New Device for 10.6 μm Heterodyne Detection at 2 GHz", by R. B. Broudy, D. R. Resler, P. W. Pastel, M. B. Reine and C. C. Wang in Proc. IRIS Detector, 1987, Vol. III, p. 189–200.

SUMMARY OF THE INVENTION

A selected embodiment of the present invention is a photovoltaic diffractive resonant optical cavity detector cell for detecting incident infrared radiation in a selected bandwidth range defined by a first wavelength and a second, longer wavelength. The detector cell includes a diffractive grating structure comprising a plurality of parallel, elongate photovoltaic segments spaced apart periodically at a spacing which is equal to or less than the first wavelength of the bandwidth range. Each photovoltaic segment has a first portion having a first conductivity type and a second portion having a second conductivity type to form a p-n junction between the first and second portions. The first portions are electrically connected together, and the second portions are electrically connected together. A planar reflector is positioned offset from the photovoltaic segments. The photovoltaic diffractive grating structure combined with the planar reflector form a diffractive resonant optical cavity structure in which the incident infrared radiation is efficiently coupled into trapped diffractive modes and efficiently absorbed. A detection signal is produced between the first and second portions of the photovoltaic segments in response to reception of incident infrared radiation.

BRIEF DESCRIPTION OF THE DRAWINGS

For a more complete understanding of the present invention and the advantages thereof, reference is now made to the following description taken in conjunction with the accompanying drawings, which are not necessarily shown to scale, in which.

DETAILED DESCRIPTION OF THE INVENTION

Figure 1:
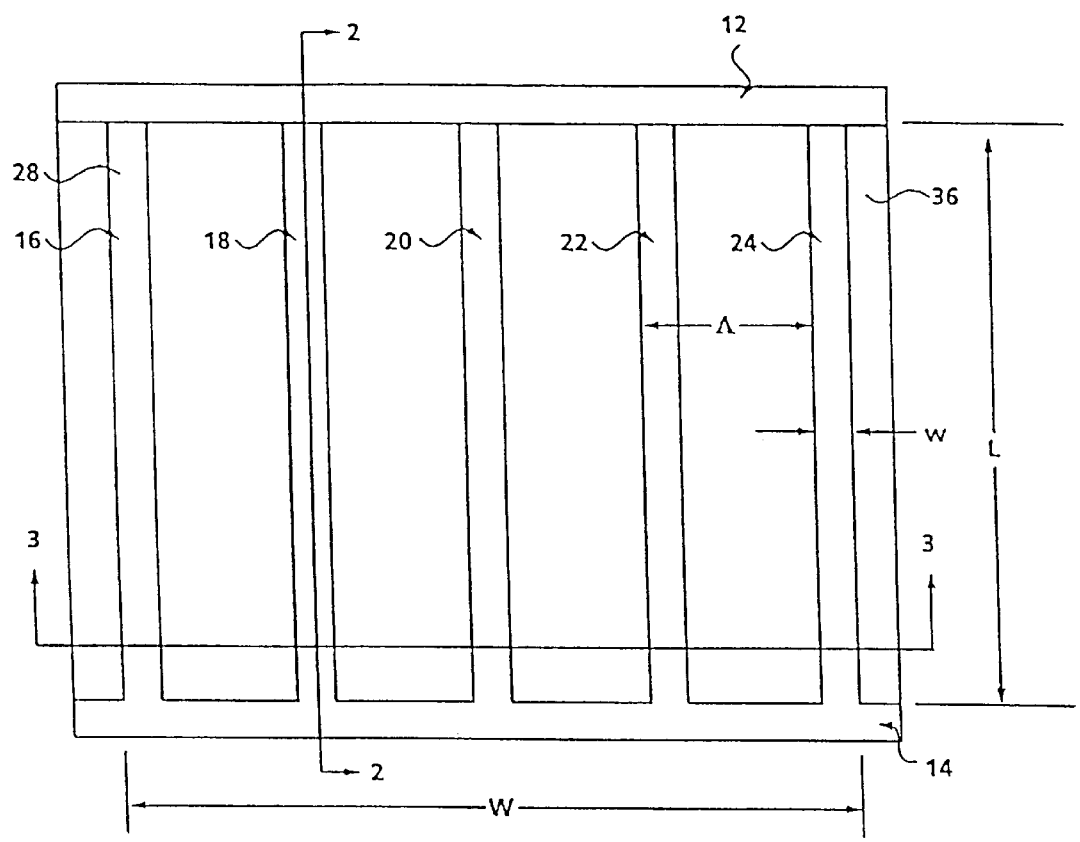
FIG. 1 is a planar view of a one-dimension polarization sensitive infrared detector cell in accordance with the present invention.
Figure 2:
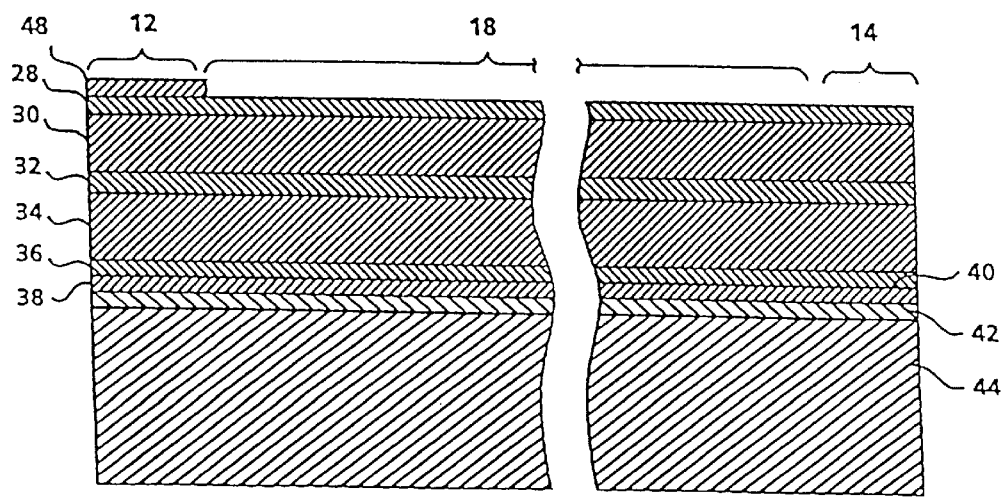
FIG. 2 is a section view taken along line 2—2 of a segment of the infrared detector cell shown in FIG. 1.
Figure 3:
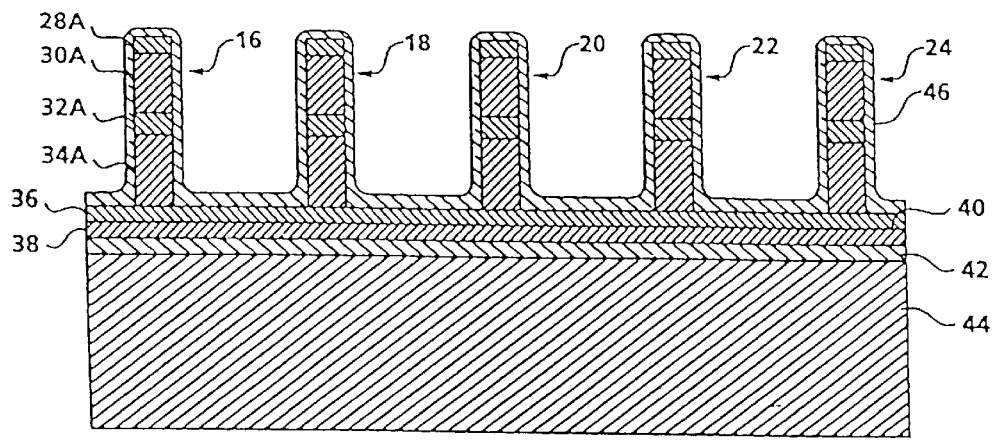
FIG. 3 is a section view taken along line 3—3 illustrating a group of segments in the infrared detector cell shown in FIG. 1.

A first embodiment of the present invention is illustrated in FIGS. 1, 2, and 3. An infrared detector cell 10 functions as a diffractive resonant optical cavity diode. The cell 10 includes parallel photovoltaic segments 16, 18, 20, 22 and 24, each comprising a plurality of layers as shown in section views in FIGS. 2 and 3. The parallel segments 16, 18, 20, 22 and 24 make up a one-dimensional diffractive grating structure. A transverse segment 14 interconnects the segments 16, 18, 20, 22 and 24.

The segments 16, 18, 20, 22 and 24 are made up of etched portions of a conductive layer 28, a base layer 30, a p-n junction 32 and a cap layer 34. The cell 10 further includes a conductive layer 36 and a passivation layer 46. The characteristics of these layers are set forth as follows, where the symbol "A" represents the dimensional unit "angstrom":

| ELEMENT | THICKNESS | MATERIAL |
| --- | --- | --- |
| Conductive Layer 28 | 1,000 Å | HgTe (conductive semi-metal) |
| Base Layer 30 | 7,000 Å | HgCdTe (x ≈ .21–.225) (indium or iodine doped n-type $10^{15}/cm^3$) |
| Junction 32 | 5,000 Å | Graded p-n junction between layers 30 and 34 |
| Cap Layer 34 | 15,000 Å | HgCdTe (x ≈ 0.26–0.3) (arsenic doped p-type $10^{17}/cm^3$) |
| Conductive Layer 36 | 1,000 Å | HgTe (conductive semi-metal) |
| Passivation Layer 46 | 1,000 Å | CdTe (nonconductive) |

Mercury cadmium telluride ($Hg_{1-x}Cd_xTe$) is characterized by the symbol "x" which represents the proportion of Cd to Te. The proportion of Te is represented by "1-x".

The diffractive resonant optical cavity diode as described is a p-on-n heterojunction diode configuration. Alternative embodiments include n-on-p heterojunction configuration, or, p-on-n or n-on-p homojunction configurations. In a homojunction, the base and cap layer "x" values are the same. In a heterojunction, the base and cap "x" values are different.

A segment structurally similar to segment 14 is located beneath conductor 12 and provides the same electrical functions as segment 14.

An aluminum conductor 12 is a strip of deposited aluminum which is in electrical contact with the layer 28. Conductor 12 has a thickness of approximately 500 A and a width of approximately 5 microns.

The detector cell 10 shown in FIGS. 1, 2 and 3 is designed for receiving in the long wave infrared (LWIR) radiation band, i.e., wavelengths in the range of 8–12 microns. The uniform spacing distance of the segments 16, 18, 20, 22 and 24 is defined as the "period" of the diffractive grating structure and is represented in FIG. 1 by the symbol "Λ". The period, Λ, of the cell 10 is less than or equal to the shortest wavelength in the radiation band of interest. For this embodiment, Λ is 8.0 microns. Using this period, the diffraction of reflected infrared radiation is suppressed while the diffraction of infrared radiation in the diffractive resonant optical cavity is promoted. The efficient coupling of diffractive mode energy in the diffractive resonant optical cavity structure leads to high absorption of infrared energy. Hence, cell 10 is referred to as a "diffractive resonant optical cavity" structure. The cavity extends from the surface of the reflector layer to the upper surface of the passivation layer.

The width of each of the segments 16, 18, 20, 22 and 24 is represented in FIG. 1 by the symbol "w". The preferred w for these segments of cell 10 is 1.5 microns.

The overall width of the detector cell 10 is represented by the symbol "W" in FIG. 1. The preferred W for cell 10 is 40 microns. The overall length of the cell 10 is represented by the symbol "L". The preferred L for cell 10 is 40 microns.

The cap layer 34 is formed on the surface of layer 36 which is electrically conductive.

The conductive layer 36 is formed on the surface of a ground plane layer 38. The layer 38 comprises deposited aluminum having a thickness of approximately 500 Å. Layer 38 has a reflective surface 40 which serves to reflect incident infrared radiation received by cell 10 and forms a highly reflective surface in the diffractive resonant optical cavity structure. The layer 38 also serves as an electrical conductor which is ohmically connected to the cap layer 34 segments through the conductive layer 36.

An epoxy layer 42 bonds a substrate 44 to the ground plane layer 38. The epoxy layer 42 has a selected thickness of 10,000 Å and comprises an optical grade epoxy, such as made by Masterbond Company. The substrate 44, which preferably is 20–40 mils thick, provides a mechanical support for the cell 10 and can comprise, for example, sapphire or silicon. The substrate 44 may comprise a silicon integrated circuit which has circuit components to receive the detection signal produced at the electrical conductor outputs (such as 12 and 38) of the cell 10. Such read out integrated circuits (ROIC) for infrared detectors are shown in U.S. Pat. No. 5,179,283 to Cockrum et al., which issued Jan. 12, 1993 and is entitled "Infrared Detector Focal Plane", and U.S. Pat. No. 4,970,567 to Ahlgren et al., which issued Nov. 13, 1990 and is entitled "Method and Apparatus for Detecting Infrared Radiation, Monolithic Photodetector", and these two issued U.S. patents are incorporated herein by reference.

The detector cell 10 further includes the passivation layer 46, comprising nonconductive CdTe. Layer 46 is shown only in FIG. 3, not FIGS. 1 and 2, for clarity of illustration.

The distance from the reflective surface 40 to the upper surface of the passivation layer 46 is approximately an odd multiple of the effective wavelength of the incident infrared radiation in the region between the reflective surface 40 and the upper surface of the passivation layer 46. For the present embodiment, this distance is 3.0 microns which is a 3 factor multiple of the effective quarter wavelength of approximately 1.0 micron. The effective quarter wavelength is the free space quarter wavelength (which is 2.5 microns for a detector designed to operate at a wavelength of 10 microns) divided by the effective refractive index for this embodiment. The refractive index varies from layer to layer, but for the structure 10 as a whole, the effective refractive index is 2.5. This yields the effective quarter wavelength of 1.0 micron.

Fabrication of the detector 10 is preferably performed as follows. The base layer 30, junction 32 and cap layer 34 are epitaxially grown on a substrate (not shown) of CdTe, CdZnTe, or GaAs, with the value of "x" and extrinsic doping being changed as the growing proceeds to produce the layers 30 and 34 and junction 32 as described above.

The conductor layer 36 is deposited or epitaxially grown on the cap layer 34 and the aluminum ground plane layer 38 is deposited on the conductor layer 36.

The device, as thus far produced, is bonded to the substrate 44 by the epoxy layer 42. The substrate (not shown), on which the layer 30 was grown, is then removed by use of selective etching, for example, the use of HF, peroxide ($H_2O_2$) and water ($H_2O$), or $HNO_3$, $H_2O_2$ and $H_2O$.

The conductor layer 28 is deposited on the base layer 30.

A conventional resist is applied to the layer 28 in the desired configuration for forming the diffractive structure consisting of segments 14, 16, 18, 20, 22, 24 and a corresponding segment beneath strip 12. Etching is preferably performed by bromine ethylene glycol aerosol etching or free methyl radical plasma etching.

The aluminum conductor 12 is delineated and deposited on the layer 28 using standard photolithographic lift-off processing.

The detector cell 10 shown in FIGS. 1, 2, and 3 primarily absorbs only one linear polarity of the incident infrared radiation because of the physical configuration of the elongate segments 16, 18, 20, 22 and 24, which receive the incident infrared radiation. A two-dimension polarity detector cell 100 is described below in reference to FIG. 6.

Referring to FIGS. 1, 2 and 3, the detector cell 10 receives incident, primarily normal, infrared radiation. The detector cell 10 with the segments 16, 18, 20, 22 and 24 functions as an optical diffraction grating as described in "Analysis and Applications of Optical Diffraction by Gratings" by Thomas K. Gaylord and M. G. Moharam in Proceedings of the IEEE, Vol. 73, No. 5, May 1985. The detector cell 10, which includes the reflective ground plane layer 38, operates as a diffractive resonant optical cavity. Incident infrared radiation is efficiently coupled into diffractive mode energy in cell 10 and absorbed in the base layer 30 to generate a photovoltaic current between the base layer 30 and cap layer 34 in each of the segments 16, 18, 20, 22 and 24. This current comprises a detection signal which is conducted through the interconnect segments of layer 30, including segment 14, to the aluminum conductor 12, and through the conductor layer 36 to the conductive ground plane layer 38. Thus, the detection signal for cell 10 is produced between aluminum conductor 12 and aluminum ground plane layer 38. The detection signal for one cell 10 preferably represents a picture element (pel) within an array of cells 10. A plurality of such detection signals can be used to produce an image.

The detection signals for each of a group of cells 10 can be provided to an ROIC substrate, as noted above, to produce a composite infrared image.

Figure 4:
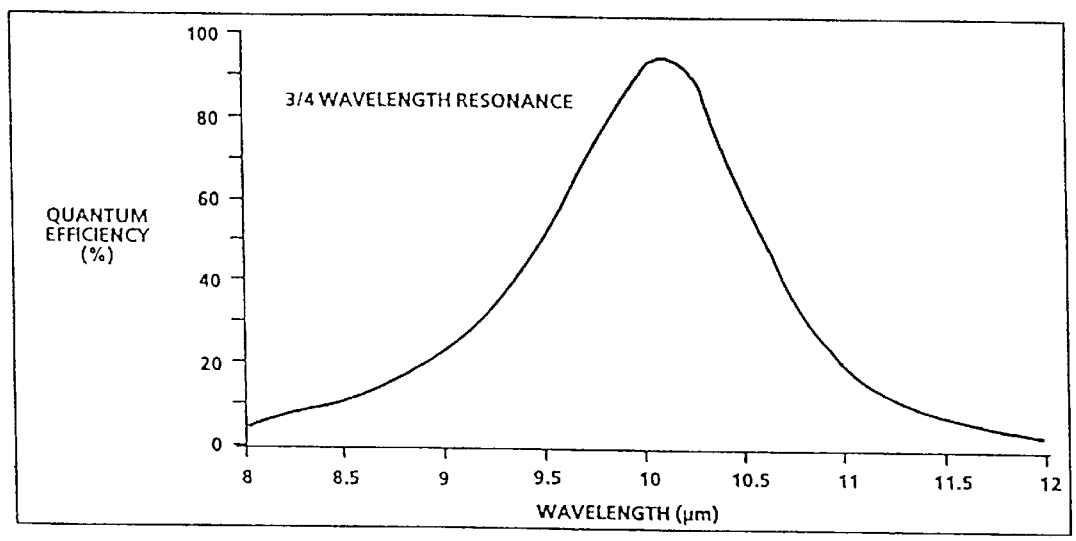
FIG. 4 is a graph of predicted infrared energy absorbance for detector cell 10.

FIG. 4 is a graph representing the predicted quantum efficiency of the detector cell shown in FIGS. 1–3. Cell 10 is optimized for detection in the middle of the 8–12 micron band at approximately 10 microns.

Figure 5:
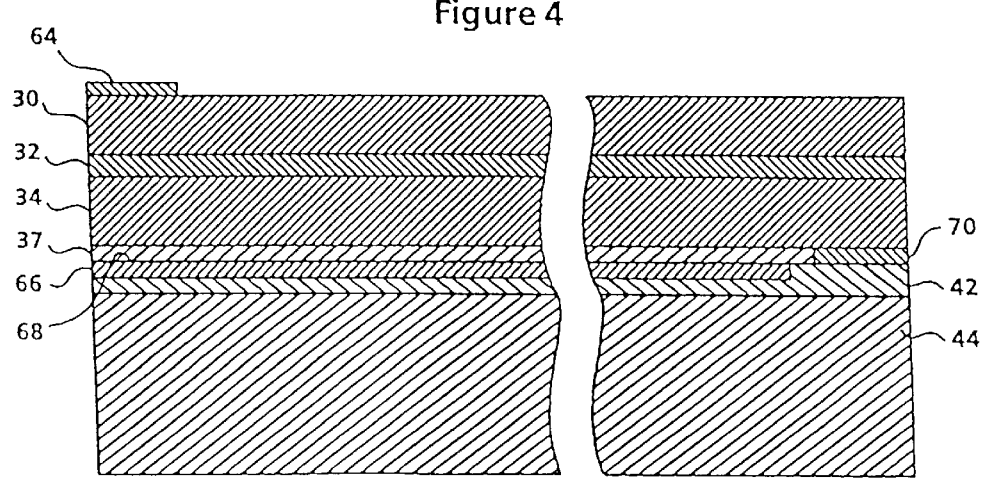
FIG. 5 is a section view of a further embodiment of the present invention which comprises a modified segment of an infrared detector cell as shown in FIG. 1 with the addition of metal contacts to the base and cap layers.

A second embodiment of the present invention is a detector cell 60 illustrated in a section view in FIG. 5, which corresponds to the section view in FIG. 2. This embodiment is a modification of the embodiment shown in FIGS. 1, 2, and 3. Like reference numerals previously described above refer to like elements in detector cell 60. A passivation layer 37 of CdTe having a thickness of approximately 1000 A is formed on layer 34. An aluminum groundplane layer 66 having a thickness of approximately 1000 A is formed on layer 37 thereby producing a reflective surface 68 at the interface of the layers 37 and 66.

A conductive strip 70, preferably aluminum having a thickness of 1000 A, is formed on and in electrical contact with layer 34. An aluminum strip 64, having a thickness of 1000 A, is formed on layer 30.

In detector cell 60, the detection signal is produced between the conductive strips 64 and 70.

Figure 6:
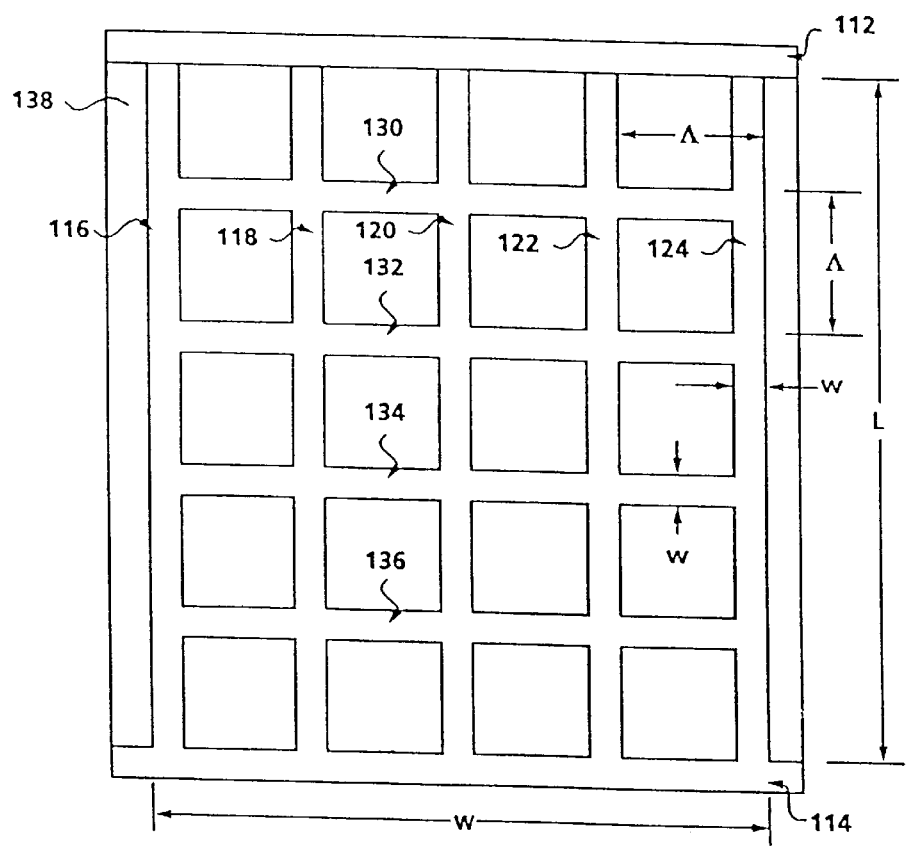
FIG. 6 is a planar view of a further embodiment of the present invention which includes transverse segments for a two-dimension polarization independent design.

A further embodiment of the present invention is a detector cell 100 shown in FIG. 6. Cell 100 is similar to cell 10 shown in FIG. 1 but includes added transverse photovoltaic segments, physically corresponding to the previously described segments 16, 18, 20, 22, and 24. The horizontal and transverse photovoltaic segments form a rectangular two-dimensional diffraction grating.

Detector cell 100 includes vertical photovoltaic segments 116, 118, 120, 122, and 124 together with intersecting horizontal photovoltaic segments 130, 132, 134, and 136. Layer 112 is a similar aluminum layer to layer 12 shown in FIG. 1. A photovoltaic segment 114 corresponds to segment 14 in FIG. 1. The spacing and dimensions of the horizontal and vertical segments in detector cell 100 correspond to the segment spacing in cell 10 shown in FIGS. 1, 2, and 3.

The detector cell 100 absorbs both horizontally and vertically polarized infrared radiation and is thus an unpolarized detector. The detector cell 100 has a cross-section configuration substantially as shown in FIGS. 2 and 3 and having the following characteristics (the material is the same as shown in the chart for detector cell 10):

| Element | Thickness |
| --- | --- |
| Conductive Layer 28 | 1,000 Å |
| Base Layer 30 | 7,000 Å |
| Junction 32 | 5,000 Å |
| Cap Layer 34 | 15,000 Å |
| Conductive Layer 36 | 1,000 Å |
| Passivation Layer 46 | 1,000 Å |

Figure 7:
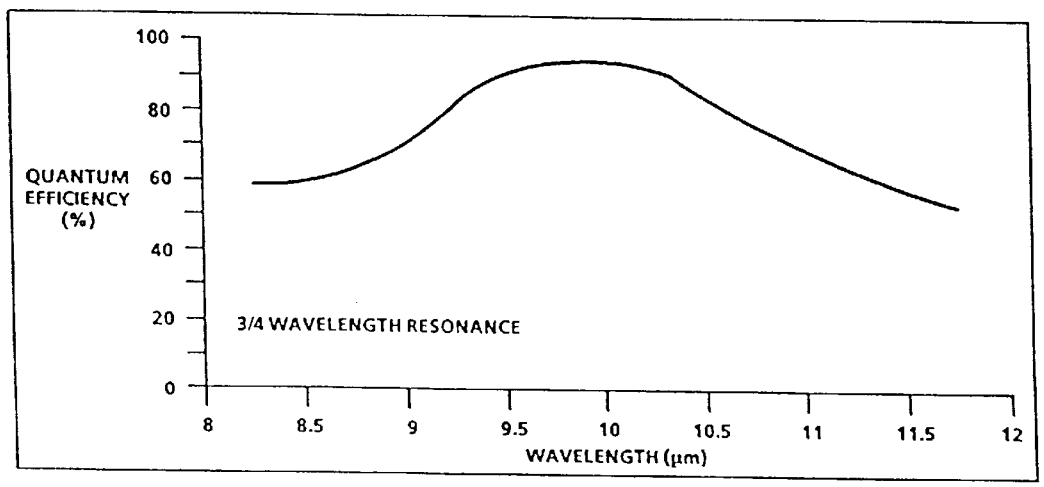
FIG. 7 is a graph of predicted infrared energy absorptance for detector cell 100 shown in FIG. 6.

The predicted spectral quantum efficiency, for a ¾ wavelength resonance detector cell 100, is shown in FIG. 7 for a detector cell, as shown in FIG. 6, in which the base layer 30 has x=0.21, and the cap layer 34 has x=0.26. The total diode thickness is 3.0 microns. The period Λ is 7 microns, and the width w is 1.0 micron. The passivation layer 46 in this embodiment is 1000 A. The effective refractive index for detector cell 100 is 2.5. This yields an effective quarter wavelength of 1 micron.

Referring to FIG. 7, it can be seen that the predicted quantum efficiency exceeds 90% at the mid-region of the 8–12 micron band of interest. The detector cell 100 is optimized for detection in the middle of the 8–12 micron band at 10 microns.

The embodiments of the invention described herein involve the mercury cadmium telluride material system for operation in the LWIR spectral band. Operation in the LWIR band can also be achieved if an indium gallium antimonide/indium arsenide or indium antimonide arsenide/indium antimonide strained layer superlattice material system is used. The invention can be applied to the mid wavelength spectral band (3–5 microns) using mercury cadmium telluride, indium antimonide, indium gallium antimonide or indium antimonide arsenide material systems. The invention can also be applied to the short wavelength spectral band (2–2.5 microns) using the indium gallium arsenide material system.

The detector cells of the present invention can be scaled for optimization at selected infrared wavelengths. The detector cell 10 and cell 100 embodiments are optimized for use in the 8–12 micron infrared radiation band with peak response in the middle of the band for approximately 10 micron infrared radiation. The thickness of the various layers (shown above in charts for cells 10 and 100) can be varied to produce optimizations at other infrared wavelengths.

The advantage of a photovoltaic diffractive resonant optical cavity design over a photovoltaic refractive resonant optical cavity infrared detector and a conventional photovoltaic detector as described in "Photovoltaic Infrared Detectors" by M. B. Reine, A. K. Soud and T. J. Tredwell in *Semiconductors and Semimetals, Vol 18, Mercury Cadmium Telluride*, edited by R. K. Willardson and A. C. Beer, Academic Press, 1981, Chapter 6, is that the photovoltaic diode volume and cross-sectional area are reduced without a reduction in infrared radiation absorptance thereby leading to higher D* performance and increased diode resistance.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

What we claim is:

1. A photovoltaic diffractive resonant optical cavity detector cell for detecting incident infrared radiation in a selected bandwidth range defined by a first wavelength and a second, longer wavelength, comprising:

a plurality of parallel, periodically spaced, elongate, photovoltaic segments having a periodic spacing which is approximately equal to or less than said first wavelength of said infrared radiation, each said segment including a first portion having a first conductivity type and a second portion having a second conductivity type, each said segment having a p-n junction between said first and said second portions and said p-n junction extending substantially along the length of the segment, a first electrical conductor interconnecting said first portions of said segments and a second electrical conductor interconnecting said second portions of said segments, a planar reflector for reflecting said infrared radiation, said reflector being parallel with and offset from said photovoltaic segments, wherein the distance from said planar reflector to an upper surface of said segments is approximately an odd multiple of a quarter of the effective wavelength of said incident infrared radiation, and wherein said detector cell produces a detection signal between said first and second electrical conductors in response to reception of said incident infrared radiation.

2. A detector cell as recited in claim 1 wherein said first electrical conductor includes interconnected strips of a conductive layer contacting said first portions of said photovoltaic segments.

3. A detector cell as recited in claim 2 wherein said first conductor includes a metallic conductor layer formed in contact with at least a part of said interconnected strips of said conductive layer.

4. A detector cell as recited in claim 1 wherein said second electrical conductor comprises a planar conductive layer together with said planar reflector.

5. A detector cell as recited in claim 1 including an electrically conductive spacer layer in contact between said second portions of said photovoltaic segments and said planar reflector.

6. A detector cell as recited in claim 1 wherein said first electrical conductor includes a transverse segment which is structurally similar to each of said photovoltaic segments and is electrically connected to common ends of said photovoltaic segments, and said first electrical conductor includes an electrically conductive strip layer in electrical contact with said first portions of said photovoltaic segments.

7. A detector cell as recited in claim 1 wherein said first electrical conductor comprises a group of interconnected planar conductive strips fabricated on and electrically contacting said first portions of said photovoltaic segments.

8. A detector cell as recited in claim 1 wherein said second electrical conductor comprises a planar conductive strip fabricated in contact with and electrically contacting said second portions of said photovoltaic segments.

9. A detector cell as recited in claim 8 including an insulative layer between said reflector and substantial parts of said second portions of said photovoltaic segments, wherein said reflector is not in electrical contact with said planar conductive strip.

10. A detector cell as recited in claim 1 including a planar substrate bonded to a planar surface of said reflector opposite said photovoltaic segments.

11. A detector cell as recited in claim 1 including a passivation layer covering exposed surfaces of said photovoltaic segments and said first electrical conductor.

12. A detector cell as recited in claim 1 wherein said photovoltaic segments are coplanar.

13. A photovoltaic diffractive resonant optical cavity detector cell for detecting incident infrared radiation in a selected bandwidth range defined by a first wavelength and a second, longer wavelength, comprising:
   a plurality of parallel, periodically spaced, elongate, photovoltaic segments having a periodic spacing which is approximately equal to or less than said first wavelength of said infrared radiation, each said segment including a first portion having a first conductivity type and a second portion having a second conductivity type, each said segment having a p-n junction between said first and second portions and extending substantially along the length of the segment,
   a plurality of first linear conductor segments positioned respectively on and electrically contacting said first portions of said photovoltaic segments, and at least one second linear conductor segment contacting and electrically interconnecting said first linear conductor segments,
   a planar, electrically conductive layer contacting and electrically interconnecting said second portions of said photovoltaic segments,
   a conductive, planar reflector for reflecting said infrared radiation, said reflector physically and electrically contacting said planar electrically conductive layer, and
   wherein said detector cell produces a detection signal between said electrically interconnected first linear conductor segments and said conductive reflector in response to said incident infrared radiation.

14. A detector cell as recited in claim 13 wherein a reflective surface of said reflector is parallel with and offset from a plane which includes an upper surface of said photovoltaic segments, and the distance between said reflective surface and said plane is approximately an odd multiple of a quarter of the effective wavelength of said incident infrared radiation.

15. A detector cell as recited in claim 13 including a planar substrate bonded to a planar surface of said reflector opposite said conductive layer.

16. A detector cell as recited in claim 13 including a passivation layer covering exposed surfaces of said photovoltaic segments, said first conductor segments, said second conductor segment and said conductive layer.

17. A detector cell as recited in claim 13 including a metallic conductor line formed in physical and electrical contact with said second linear conductor segment.

18. A detector cell as recited in claim 13 wherein said photovoltaic segments are coplanar.

19. A photovoltaic diffractive resonant optical cavity detector cell for detecting incident infrared radiation in a selected bandwidth range defined by a first wavelength and a second, longer wavelength, comprising:
   a plurality of parallel, periodically spaced, elongate, first photovoltaic segments having a periodic spacing which is approximately equal to or less than said first wavelength (C) of said infrared radiation, each said first photovoltaic segment including a first portion having a first conductivity type and a second portion having a second conductivity type, each said first segment have a p-n junction between the respective first and second portions and extending substantially along the length of the segment,
   a plurality of parallel, periodically spaced, elongate, second photovoltaic segments having a periodic spacing which is approximately equal to or less than said first wavelength of said infrared radiation, each said second photovoltaic segment including a first portion having a first conductivity type and a second portion having a second conductivity type, each said second segment having a p-n junction between the first and second portions of the respective second segment and extending along the length of the respective second segment,
   said second photovoltaic segments being positioned transverse to said first photovoltaic segments wherein said first and second photovoltaic segments form a two-dimensional grid,
   said first portions of said first photovoltaic segments being electrically connected to said first portions of said second photovoltaic segments and said second portions of said first photovoltaic segments being electrically connected to said second portions of said second photovoltaic segments,
   a plurality of first linear conductor segments positioned on and electrically contacting said first portions of said first photovoltaic segments and a plurality of second linear conductor segments positioned on and electrically contacting said first portions of said second (C) photovoltaic segments, said first linear conductor segments being electrically connected to said second linear conductor segments,
   a planar, electrically conductive layer contacting and electrically interconnecting said second portions of said first and second photovoltaic segments,
   a conductive, planar reflector for reflecting said infrared radiation, said reflector physically and electrically contacting said planar electrically conductive layer, and
   wherein said detector cell produces a detection signal between said electrically interconnected first and second linear conductor segments and said conductive reflector in response to said incident infrared radiation.

20. A detector cell as recited in claim 19 wherein a reflective surface of said reflector is parallel with and offset from a plane which includes an upper surface of said first and second photovoltaic segments, and the distance between said reflective surface and said plane is an odd multiple of a quarter of the effective wavelength of said incident infrared radiation.

21. A detector cell as recited in claim 19 including a planar substrate bonded to a planar surface of said reflector opposite said conductive layer.

22. A detector cell as recited in claim 19 including a passivation layer covering exposed surfaces of said first and second photovoltaic segments, said first and second linear conductor segments and said conductive layer.

23. A detector cell as recited in claim 19 wherein said first and second photovoltaic segments are coplanar.

* * * * *